US012615053B1

(12) United States Patent
Dedic et al.

(10) Patent No.: US 12,615,053 B1
(45) Date of Patent: Apr. 28, 2026

(54) INDUCTOR BASED TAIL CURRENT SOURCE FOR CURRENT STEERING DAC

(71) Applicant: Cisco Technology, Inc., San Jose, CA (US)

(72) Inventors: Ian Dedic, Maynard, MA (US); Darren Walker, Maynard, MA (US)

(73) Assignee: Cisco Technology, Inc., San Jose, CA (US)

( * ) Notice: Subject to any disclaimer, the term of this patent is extended or adjusted under 35 U.S.C. 154(b) by 91 days.

(21) Appl. No.: 18/611,071

(22) Filed: Mar. 20, 2024

Related U.S. Application Data

(60) Provisional application No. 63/453,440, filed on Mar. 20, 2023.

(51) Int. Cl.
    *H03M 1/10* (2006.01)
(52) U.S. Cl.
    CPC ................................. *H03M 1/1009* (2013.01)
(58) Field of Classification Search
    CPC .................................................. H03M 1/1009
    See application file for complete search history.

(56) References Cited

U.S. PATENT DOCUMENTS

| | | | | |
|---|---|---|---|---|
| 6,833,801 B1 * | 12/2004 | Ostrem | ............ | H03K 17/04106 |
| | | | | 341/144 |
| 6,967,609 B1 * | 11/2005 | Bicakci | ............ | H03K 17/04106 |
| | | | | 341/172 |
| 7,978,112 B2 * | 7/2011 | Terranova | ........... | H03M 1/0604 |
| | | | | 341/120 |
| 8,576,099 B2 * | 11/2013 | Roze | ........................ | H03M 9/00 |
| | | | | 341/100 |
| 10,084,422 B1 * | 9/2018 | Elzeftawi | ............. | H03G 1/0023 |
| 10,148,277 B1 * | 12/2018 | Singh | ................... | H03M 1/0863 |
| 11,245,410 B1 * | 2/2022 | Dalla Longa | ........... | H03M 1/66 |
| 12,184,751 B2 * | 12/2024 | Kundu | ............... | H03K 5/15006 |
| 2019/0036541 A1 * | 1/2019 | Wong | ..................... | H03M 1/747 |
| 2023/0036535 A1 * | 2/2023 | Darzy | ..................... | H03M 1/66 |

FOREIGN PATENT DOCUMENTS

EP                3754852 A1 * 12/2020   .......... H03M 1/1215

* cited by examiner

*Primary Examiner* — Thomas D Alunkal

(74) *Attorney, Agent, or Firm* — Patterson + Sheridan, LLP

(57)                    ABSTRACT

In one embodiment, the disclosure relates to a current steering DAC system. The system may include a current steering digital to analogy converter (DAC) that includes a clock buffer configured to generate a first clock signal having a first frequency and a second clock signal having a second frequency; a tail node; a first clock switch in electrical communication with the tail node; a second clock switch in electrical communication with the tail node; and a current source comprising an inductor having an inductance, the current source in electrical communication with the tail node.

20 Claims, 3 Drawing Sheets

INDUCTOR BASED TAIL CURRENT SOURCE FOR CURRENT STEERING DAC

CROSS REFERENCE TO RELATED APPLICATIONS

This application claims priority to and the benefit of U.S. Provisional Patent Application No. 63/453,440 filed on Mar. 20, 2023, the disclosure of which is herein incorporated by reference in its entirety.

FIELD

This disclosure relates generally to the field of digital to analog conversion in integrated circuits.

BACKGROUND

Contemporary integrated circuits make extensive use of digital to analog converter circuits that are advantageously mass-produced in various configurations for various purposes.

BRIEF DESCRIPTION OF THE FIGURES

Unless specified otherwise, the accompanying drawings illustrate aspects of the innovations described herein. Referring to the drawings, wherein like numerals refer to like parts throughout the several views and this specification, several embodiments of presently disclosed principles are illustrated by way of example, and not by way of limitation. The drawings are not intended to be to scale. A more complete understanding of the disclosure may be realized by reference to the accompanying drawings in which.

OVERVIEW

Figure 1:
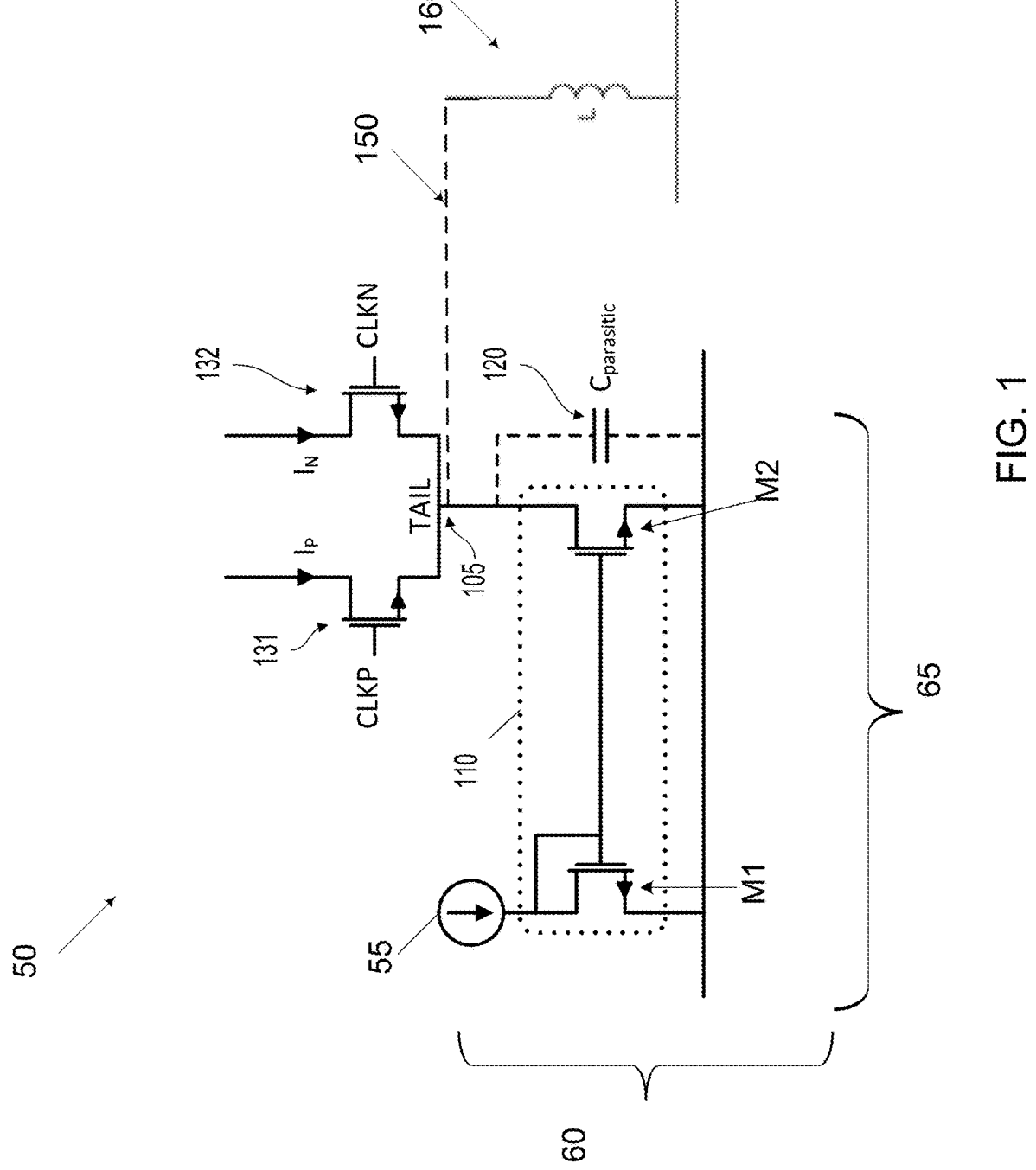
FIG. 1 is a standard MOS-based current source with a parasitic capacitance connected to a single-bit DAC segment that may be replaced by one or more inductors according to an exemplary embodiment of the disclosure.

In part, the disclosure relates to a current steering DAC system. The system may include a current steering digital to analog converter (DAC) that includes a clock buffer configured to generate a first clock signal having a first frequency and a second clock signal having a second frequency; a tail node; a first clock switch in electrical communication with the tail node; a second clock switch in electrical communication with the tail node; and a current source comprising an inductor having an inductance, the current source in electrical communication with the tail node.

EXEMPLARY EMBODIMENT

A high-performance current-steering digital to analog converter (DAC) operating at tens of gigasamples per second benefits from a current source which can switch current quickly at the output of clock switches. In various embodiments, a current-steering DAC includes one or more MOS or MOSFET current devices and may include additive features for summing currents. Refer now to the exemplary embodiment of FIG. 1, a current-steering DAC 50 includes a current source 55 and one or more MOS or MOSFET current devices M1, M2 as shown generally within brackets 60 and 65. MOS-based mirror current sources require large transistor sizes to achieve good matching and the large transistor size adds a significant parasitic capacitance as shown by capacitor 120 at a tail node 105 of a DAC segment. In many embodiments, a ripple voltage present at the tail node charges and discharges the parasitic capacitance, thereby reducing the edge rate of the output current from the switching pair/clock switches 131, 132. The tail voltage ripple is high in frequency, equal to twice the clock frequency $2f_{CLK}$, and so the parasitic capacitance significantly lowers the tail node impedance, wasting current.

In some embodiments, a lowering of tail node impedance can be partially mitigated by careful control of the clock waveform edge rates and cross-over points to minimize a voltage ripple on the tail node. However, this can increase clock power significantly at very high sample rates and in practice is hard to control consistently across process and temperature. In some embodiments, one or more cascode transistors or other circuit elements may also be added between the overall current source 110 and switching pair/clock switches 131, 132 to reduce the capacitance. In some embodiments additional cascode devices or other elements may not be desirable given their power requirements and continued contribution of an associated parasitic capacitance.

In many embodiments, generating sinewave clocks with tuned circuits may be advantageous from a power-efficiency standpoint. However, adopting this technique for a MOS-based high-parasitic current source may result in a worst-case scenario or otherwise a significant degradation in device performance because a significant tail ripple at $2f_{CLK}$ may result. In many other embodiments, Applicants have determined that it is useful to replace elements that form the overall current source 110 and other components within brackets 60 and 65 that extend from and connect to the tail with an inductor 160 having an inductance L. In some embodiments, inductor 160 may include one or more inductors. Dotted line 150 shows the electrical path from the tail to inductor 160 that may replace the other elements shown on the left. In some embodiments, inductor 160 is also in communication with other electrical components. Additional inductor-based embodiments are discussed in more detail below. In some embodiments, one or more inductor(s) is/are configured to resonate at a frequency of $2f_{CLK}$ and thereby reduce a parasitic capacitance of the current source.

Figure 2:
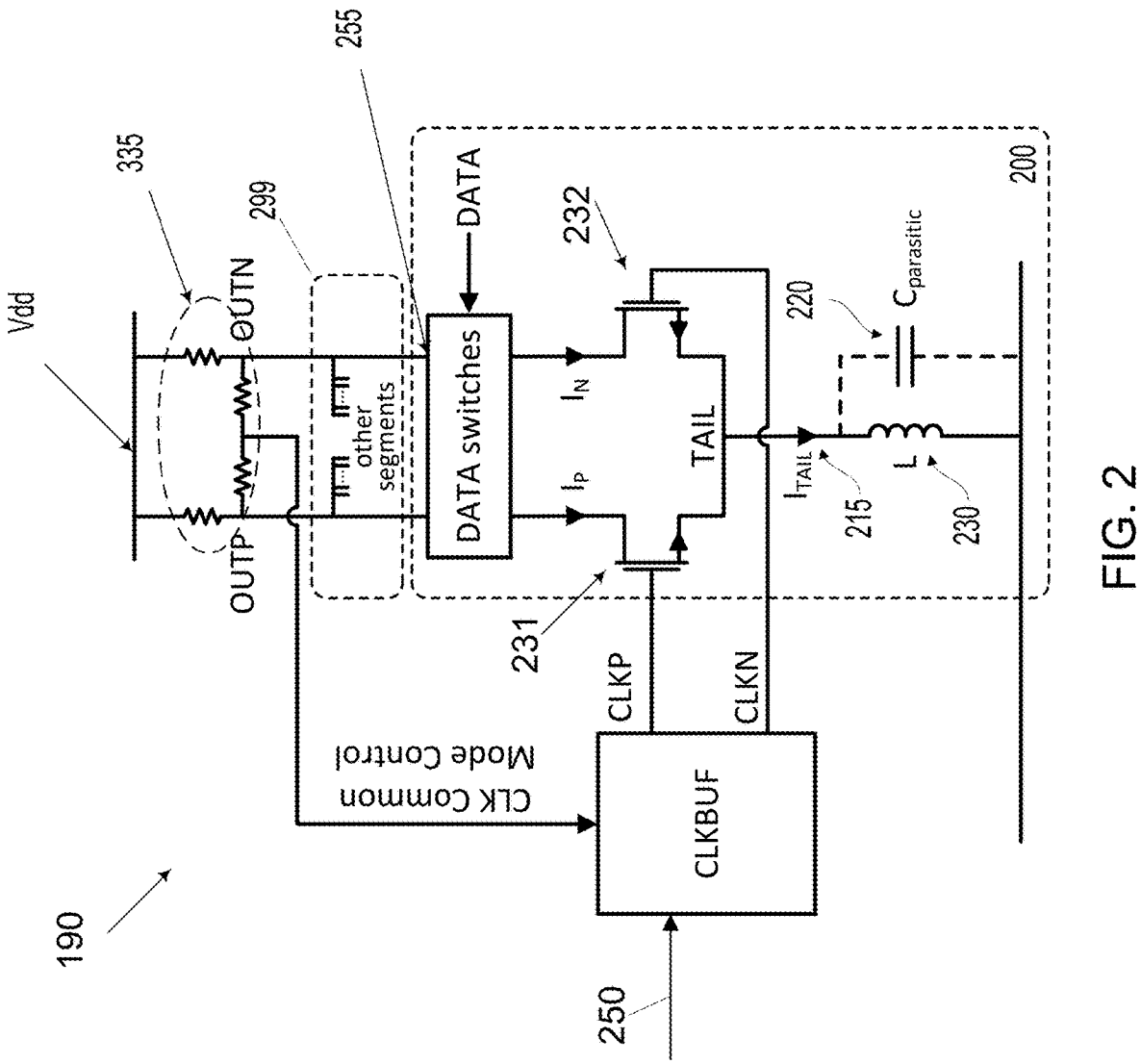
FIG. 2 is a current-steering segmented DAC with an inductor-based current source according to an exemplary embodiment of the disclosure.

Refer now to the exemplary current steering DAC system embodiment 190 of FIG. 2. In some embodiments, Applicant has realized that if the MOS-based current source is replaced by an inductor 230, then the parasitic capacitance of the current source is removed and some, all or substantially all of the parasitic capacitance 220 on the tail node from the source nodes of the switching elements/clock switches 231, 232 may also be reduced, removed, or substantially removed. In some embodiments, the parasitic capacitance 220 on the tail node from the clock switch sources may be removed as a result of the inductor being configured to resonate such as by being tuned to $2f_{CLK}$. In many embodiments, virtually no current is lost to parasitic capacitances and the output currents have fast, square edge rates and/or transitions. See for example the advantageous square waves that result in FIG. 3 that are discussed in more detail below. For DACs and other devices operating at high clock frequencies a current source with higher impedance at the frequency of operation may be evaluated by comparing it to a conventional MOS-based current source.

Refer still to the exemplary embodiment of FIG. 2. In some embodiments, a current-steering DAC may be partitioned into thermometer-weighted segments and binary-weighted segments 200 and others segments 299. In some embodiments, switching elements/clock switches 231, 232 may include a gate, a source, and drain. In various embodiments, the switching elements 231, 232 may be MOS devices such as transistors. The gates of the switching elements 231, 232 may receive clock signals from a clock buffer (CLKBUF) through the CLKP (positive) and CLKN (negative) nodes as shown.

One or more data switches 255 such as an array of data switches that receive communication data may be in electrical communication with switching elements/clock switches 231, 232 such as through the drains of the switching elements/clock switches 231, 232. For example, an 8-bit DAC might be constructed from 7 equally weighted segments thermometer-decoded from the top 3 bits, wherein each thermometer segment would have a current of $I_{out}/8$. The lower 5 bits (LSBi for i=4, 3, 2, 1, 0) may then have a binary-weighted current, where $I_{LSB4}=I_{out}/16$, $I_{LSB3}=I_{out}/32$, and so on for each index i and the other segments.

In various embodiments, the thermometer-weighted segments and binary-weighted segments 200 and others segment 299 may also be in communication with a plurality of resistors 335 such as the arrangement of two series and two parallel resistors shown in electrical communication with nodes OUTP and OUTN. In various embodiments of the current steering DAC system the top line or rail may be Vdd as shown or a regulated DV voltage. In various embodiments, a clock common mode control signal or other feedback or control signal may be fed back to the CLKBUF from one or more circuit element in electrical communication with node OUTP and node OUTN. In some embodiments, the signals are present at OUTP and OUTN are the converted analog signals. In various embodiments, the currents from all the segments are summed and flow into the load resistors such as one or more resistors 335.

In many embodiments, an inductance L of an inductor such as inductor 230 that receives a current from the tail node is tuned such that $$2 f_{CLK} = \frac{1}{2\pi\sqrt{LC_{parasitic}}}$$

to give the highest impedance current source or other target impedance at the clock signal frequency of operation. In some embodiments, $f_{CLK}$ ranges from about 10 GHz to about 500 GHz. In some embodiments, L ranges from about 100 pH to about 5 nH. In some embodiments, $C_{parasitic}$ ranges from about 1 fF to about 20 fF. To accurately set $I_{TAIL}$ 215 to the desired value, the common mode voltage of the clocks CLKP and CLKN is controlled. In various embodiments, the inductor 230 has a parasitic series resistance, therefore the DC value of the current ITAIL=VTAIL/RIND. As a result, by moving the clock common mode up and down, the current can likewise be adjusted up and down. As shown, in various embodiments there is an additional signal 250 going into the CLKBUF, this additional signal 250 is CLK Common Mode Reference (CMR) in some embodiments. In some embodiments, CLKBUF adjusts its output common mode such that the feedback (average of OUTP/OUTN)

matches the input reference voltage such as from CLK CMR (additional signal 250). In some embodiments, the common mode voltage of the clocks may be controlled by either: (1) measuring the total output current, or (2) using a replica segment and measuring the output current from that replica. In FIG. 2, in some embodiments, the average voltage of OUTP/OUTN (which is the CLK Common Mode Control) is a measure of $I_{TAIL}$ into the two load resistors connected to VDD, i.e. (VDD-VCM)/R=SUM (all ITAILS).

In some embodiments, the current at the tail node is tuned by controlling a common mode voltage by using a replica segment and measure an output current from the replica segment. In some embodiments, the common mode of the output in normal mode may be used to control the output current. A calibration mode may also be available and suitable for calibrating every segment to make sure $I_{TAIL}$ is correct. During calibration, small changes to the output current or switching a segment current out of the main path and into a calibration measurement circuit. In turn, these small changes adjust the clock common mode if the output common mode were used. As a result, a replica segment may be used that is not affected during calibration, to control the clock common mode. In some embodiments, tuning the current at the tail node is performed by controlling a common mode voltage by using a replica segment and measure an output current from the replica segment.

Figure 3:
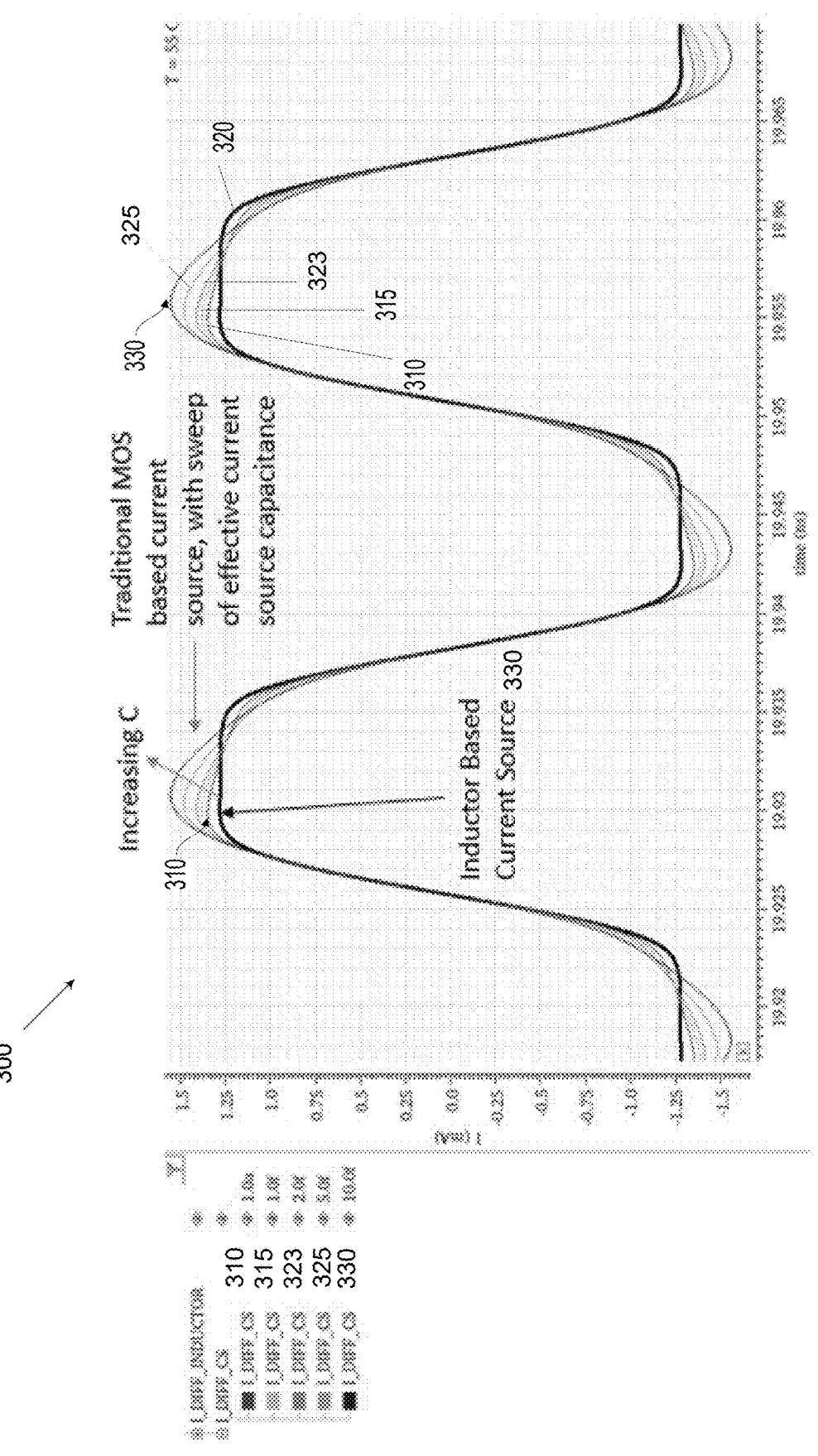
FIG. 3 is a plot of simulated, differential output current waveforms, both for a standard MOS-based current source and an inductor-based current source, according to an exemplary embodiment of the disclosure.

Refer now to the exemplary embodiment of FIG. 3, wherein simulated waveforms of the differential output current of a standard MOS-based current source and an inductor-based current source are shown in plot 300. The MOS-based current source is emulated as an ideal current source of 1.25 mA with a capacitor 120 in parallel that represents the inherent parasitic capacitance of a MOS-based current source. On the left, a legend shows the various waveforms 310, 315, 323, 325 and 330 that have been plotted based on different values for capacitor 120 as shown. As this capacitance increases, the differential output current rise and fall times decrease. Even with a 1 aF capacitance, the waveform 310 of the MOS-based source does not settle to a constant current. The waveform 320 for the inductor-based source, such as used in in FIGS. 1 and 2 with one or more inductors is stable. In some embodiments, waveform 320 settles to near-constant differential output current and more closely approximates a square wave, providing better performance for a current-steering DAC. This behavior of waveform 320 further confirms the suitability of using an inductor 160, 230 as shown in FIGS. 1 and 2.

In some embodiments, the first frequency is about $f_{CLK}$ and the second frequency is about $f_{CLK}$. In various embodiments, the inductor is configured to resonate with a parasitic capacitance $C_{parasitic}$ at a frequency of $2f_{CLK}$. In many embodiments, the inductor L at the tail node is tuned until $$2 f_{CLK} = \frac{1}{2\pi\sqrt{LC_{parasitic}}},$$

wherein $C_{parasitic}$ is the parasitic capacitance of the current source. In some embodiments, the current at the tail node is tuned by controlling a common mode voltage of the first clock switch and the second clock switch. In various embodiments, the current at the tail node is tuned by controlling a common mode voltage by using a replica segment and measure an output current from the replica segment. In some embodiments, the first clock switch is a MOS transistor. In various embodiments, the second clock switch is a MOS transistor.

In, part the disclosure relates to a method. The method may include providing a current steering digital to analogy converter (DAC) comprising a clock buffer; providing a current source comprising an inductor having an inductance L, the current source in electrical communication with a tail node; generating, using the clock buffer, a first clock signal having a first frequency; generating, using the clock buffer, a second clock signal having a second frequency, wherein the first frequency is about $f_{CLK}$ and the second frequency is about $f_{CLK}$; and resonating the inductor a the parasitic capacitance $C_{parasitic}$ at a frequency of $2f_{CLK}$:

In some embodiments, the method may further include tuning an inductance in the system until $$2f_{CLK} = \frac{1}{2\pi\sqrt{LC_{parasitic}}},$$

wherein $C_{parasitic}$ is the parasitic capacitance of the current source. In some embodiments, the method may further include controlling a common mode voltage of the first clock switch and the second clock switch to tune the current at the tail node. In some embodiments, the method may further include controlling a common mode voltage by using a replica segment and measure an output current from the replica segment to tune the current at the tail node.

In some embodiments, the method may include controlling a common mode voltage by using a replica segment and measure an output current from the replica segment to tune the current at the tail mode. In some embodiments, the method may include tuning the current at the tail node by controlling a common mode voltage of a first clock switch and a second clock switch. In some embodiments, the first clock switch is in electrical communication with the tail node. In some embodiments, the second clock switch in electrical communication with the tail node. In some embodiments, the first clock switch is a MOS transistor, and the second clock switch is a MOS transistor.

Although, the disclosure relates to different aspects and embodiments, it is understood that the different aspects and embodiments disclosed herein can be integrated, combined, or used together as a combination system, or in part, as separate components, devices, and systems, as appropriate. Thus, each embodiment disclosed herein can be incorporated in each of the aspects to varying degrees as appropriate for a given implementation. Further, the various apparatus, optical elements, mixers, metal-oxide-semiconductor (MOS) devices, MOS field-effect transistors (MOSFETs), current sources, optical paths, waveguides, splitters, couplers, combiners, electro-optical devices, inputs, outputs, ports, channels, components and parts of the foregoing disclosed herein can be used with any laser, laser-based communication system, waveguide, fiber, transmitter, transceiver, receiver, and other devices and systems without limitation.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

Where a range or list of values is provided, each intervening value between the upper and lower limits of that range or list of values is individually contemplated and is encompassed within the disclosure as if each value were specifically enumerated herein. In addition, smaller ranges between and including the upper and lower limits of a given range are contemplated and encompassed within the disclosure. The listing of exemplary values or ranges is not a disclaimer of other values or ranges between and including the upper and lower limits of a given range.

The use of headings and sections in the application is not meant to limit the disclosure; each section can apply to any aspect, embodiment, or feature of the disclosure. Only those claims which use the words "means for" are intended to be interpreted under 35 USC 112, sixth paragraph. Absent a recital of "means for" in the claims, such claims should not be construed under 35 USC 112. Limitations from the specification are not intended to be read into any claims, unless such limitations are expressly included in the claims.

Embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, embodiments may take the form of a computer program product embodied in one or more computer readable medium(s) having computer readable program code embodied thereon.

The invention claimed is:

1. A system comprising:
   a current steering digital to analog converter (DAC) comprising,
      a clock buffer configured to generate a first clock signal having a first frequency and a second clock signal having a second frequency;
      a tail node;
      a first clock switch in electrical communication with the tail node;
      a second clock switch in electrical communication with the tail node;
      a current source comprising an inductor having an inductance L, the current source in electrical communication with the tail node; and
      one or more data switches in electrical communication with the first clock switch and second clock switch and configured to receive digital communication data that is converted to analog signals, wherein the first clock switch and second clock switch are positioned between the one or more data switches and the inductor.

2. The system of claim 1, wherein the first frequency is $f_{CLK}$ and the second frequency is $f_{CLK}$.

3. The system of claim 1 wherein the inductor is configured to resonate at a frequency of $2 f_{CLK}$ and thereby reduce a parasitic capacitance of the current source.

4. The system of claim 3, wherein inductance at the tail node is tuned until $2f_{CLK}=1/2\pi\sqrt{LC_{parasitic}}$, wherein $C_{parasitic}$ is the parasitic capacitance of the current source.

5. The system of claim 4, wherein the current at the tail node is tuned by controlling a common mode voltage of the first clock switch and the second clock switch.

6. The system of claim 4, wherein the current at the tail node is tuned by controlling a common mode voltage by using a replica segment and measure an output current from the replica segment.

7. The system of claim 1, wherein the inductor is directly coupled to the tail node.

8. The system of claim 7, wherein first clock switch is a MOS transistor and the second clock switch is a MOS transistor.

9. A method comprising:
   providing a current steering digital to analog converter (DAC) comprising a clock buffer;
   providing a current source comprising an inductor having an inductance L, the current source in electrical communication with a tail node;
   generating, using the clock buffer, a first clock signal having a first frequency;
   generating, using the clock buffer, a second clock signal having a second frequency, wherein the first frequency is $f_{CLK}$ and the second frequency is $f_{CLK}$;
   resonating the inductor at a frequency of about $2f_{CLK}$; and

receiving, at one or more data switches in electrical communication with a first clock switch and a second clock switch, digital communication data that is converted to analog signals, wherein the first clock switch and second clock switch are positioned between the one or more data switches and the inductor.

10. The method of claim 9 further comprising: tuning the inductance L until $$2 f_{CLK} = \frac{1}{2\pi\sqrt{LC_{parasitic}}},$$

wherein $C_{parasitic}$ is a parasitic capacitance of the current source.

11. The method of claim 9 further comprising: controlling a common mode voltage of the first clock switch and the second clock switch to tune the current at the tail node.

12. The method of claim 9 further comprising: controlling a common mode voltage by using a replica segment and measure an output current from the replica segment to tune the current at the tail node.

13. The method of claim 9, further comprising: reducing a parasitic capacitance of the current source in response to resonating the inductor at a frequency of $2f_{CLK}$.

14. The method of claim 9 further comprising: tuning the current at the tail node by controlling a common mode voltage by using a replica segment and measure an output current from the replica segment.

15. The method of claim 9, wherein the inductor is directly coupled to the tail node.

16. The method of claim 9 further comprising: tuning the current at a tail node by controlling a common mode voltage of a first clock switch and a second clock switch.

17. The method of claim 16, wherein the first clock switch is in electrical communication with the tail node.

18. The method of claim 17, wherein the second clock switch is in electrical communication with the tail node.

19. The method of claim 18, wherein the first clock switch is a MOS transistor and the second clock switch is a MOS transistor.

20. A system comprising:
   a current steering digital to analog converter (DAC) comprising,
      a clock buffer configured to generate a first clock signal having a first frequency and a second clock signal having a second frequency;
      a tail node;
      a first clock switch in electrical communication with the tail node;
      a second clock switch in electrical communication with the tail node; and
      a current source comprising an inductor having an inductance L, the current source in electrical communication with the tail node, wherein inductance at the tail node is tuned until $2f_{CLK}=1/2\pi\sqrt{LC_{parasitic}}$, wherein $C_{parasitic}$ is the parasitic capacitance of the current source.

* * * * *